United States Patent
Hamano (10) Patent No.: US 6,457,220 B1
(45) Date of Patent: Oct. 1, 2002

(54) ELECTRONIC COMPONENT, PIEZOELECTRIC-RESONANT COMPONENT AND METHOD FOR MANUFACTURING ELECTRONIC COMPONENTS AND PIEZOELECTRIC-RESONANT COMPONENTS

(75) Inventor: Kiyotoshi Hamano, Himi (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/474,109

(22) Filed: Dec. 29, 1999

(30) Foreign Application Priority Data

Jan. 25, 1999 (JP) ............................................ 11-016244

(51) Int. Cl.[7] .............................................. H04R 17/00
(52) U.S. Cl. ...................... 29/25.35; 310/340; 310/366
(58) Field of Search ........................ 29/25.35; 310/340, 310/366, 348, 320, 344, 328

(56) References Cited

U.S. PATENT DOCUMENTS

| | | | | |
|---|---|---|---|---|
| 4,445,256 A | * | 5/1984 | Huguenin | 29/25.35 |
| 4,514,247 A | * | 4/1985 | Zola | 156/250 |
| 5,266,862 A | * | 11/1993 | Ohya | 310/328 |
| 5,717,365 A | * | 2/1998 | Kaida | 333/187 |
| 5,844,348 A | * | 12/1998 | Gamo | 310/340 |
| 6,040,652 A | * | 5/2000 | Kaida | 310/320 |
| 6,134,762 A | * | 10/2000 | Gamo | 29/25.35 |

* cited by examiner

Primary Examiner—Peter Vo
Assistant Examiner—Alan Boswell
(74) Attorney, Agent, or Firm—Keating & Bennett, LLP (57) ABSTRACT

A method of manufacturing piezoelectric resonant components includes laminating two encapsulating substrates having a piezoelectric substrate disposed therebetween. The piezoelectric substrate includes adhesive layers on the surfaces of the piezoelectric substrate for bonding the two encapsulating substrates to the piezoelectric substrate. The adhesive layers include pass-through openings at a periphery of the piezoelectric substrate such that the adhesive layers are thicker at areas around the pass-through openings. As a result, gaps are prevented from being formed at sections where the adhesive layer is thin, thereby preventing the outer electrodes from short-circuiting.

9 Claims, 6 Drawing Sheets

ELECTRONIC COMPONENT, PIEZOELECTRIC-RESONANT COMPONENT AND METHOD FOR MANUFACTURING ELECTRONIC COMPONENTS AND PIEZOELECTRIC-RESONANT COMPONENTS

BACKGROUND OF THE INVENTION

1. Field of the Invention

The present invention relates to a structure and method for manufacturing electronic components and piezoelectric-resonant components used, for example, as piezoelectric filters. Particularly, the present invention relates to a method for manufacturing electronic components and piezoelectric-resonant components, wherein an adhesive-printing method is improved for laminating a plurality of mother substrates via an adhesive agent, and also relates to an electronic component and a piezoelectric-resonant component manufactured by such a method.

2. Description of the Related Art

Conventionally, a layered structure made of a piezoelectric substrate is sandwiched by encapsulating substrates and is applied to a piezoelectric-resonant component so as to provide a space for a piezoelectric-vibration unit to vibrate. A piezoelectric-resonant component of this type is disclosed in, for example, Japanese Unexamined Utility Model Publication No. 59-127330.

Figure 7:
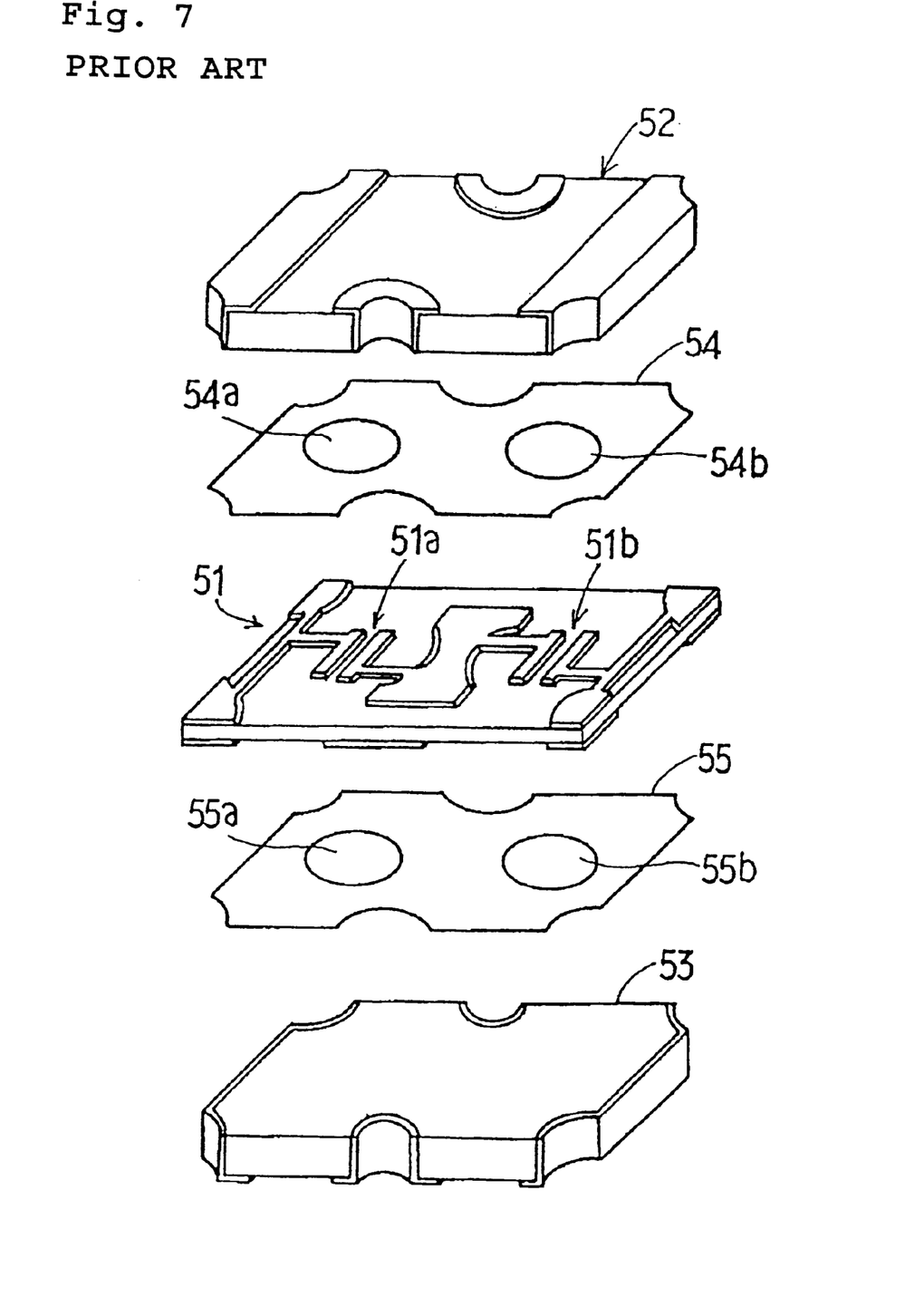
FIG. 7 is an exploded perspective view of a piezoelectric-resonant component of the related art.

Referring to FIG. 7, which is an exploded perspective view of the prior art piezoelectric-resonant component, encapsulating substrates 52 and 53 are laminated with a piezoelectric substrate 51 therebetween via adhesive layers 54 and 55.

Piezoelectric-vibration units 51a and 51b are defined by exciting electrodes that are disposed on an upper surface and a lower surface of the piezoelectric substrate 51. The adhesive layers 54 and 55 include circular openings 54a, 54b, 55a, and 55b in order to define spaces for the piezoelectric-vibration units 51a and 51b to vibrate. The adhesive layers 54 and 55 are provided by a squeegee-printed adhesive agent on the upper and the lower surfaces of the piezoelectric substrate 51. The squeegee-printing is performed so that the adhesive is not printed at areas where the openings 54a to 55b are located.

Figure 8:
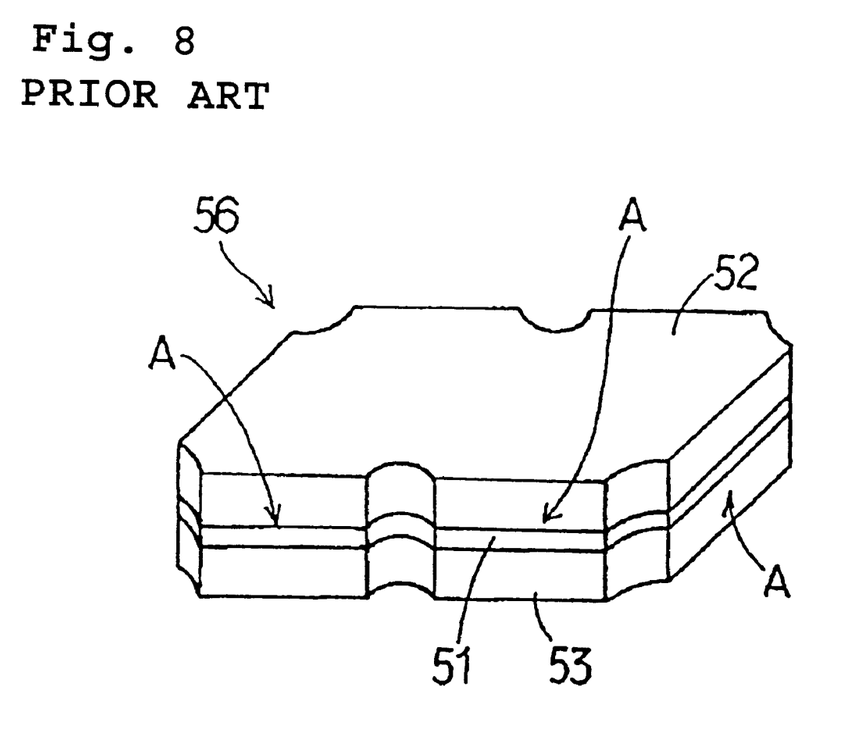
FIG. 8 is a perspective view of a related art layered product that is obtained from the laminating the units shown in FIG. 7.

A layered product 56, as shown in FIG. 8, is obtained by printing the adhesive agent defining the adhesive layers 54 and 55, and then bonding the encapsulating substrates 52 and 53. A piezoelectric-resonant component is completed by providing external electrodes (not shown) on the side surfaces of the layered product 56.

In a manufacturing process that is actually used in practice, the above layered product is produced from a mother substrate. That is, an adhesive agent is printed on a mother piezoelectric substrate, mother encapsulating substrates are laminated thereon, and a mother layered product is produced, which is cut along the thickness direction, thereby obtaining the above-described layered product 51 which defines a single piezoelectric-resonant component.

However, a problem with the piezoelectric-resonant components that are produced as described above is that the thickness of the adhesive layers varies, whereby gaps between the adhesive layers 54 and 55 and the encapsulating substrates 52 and 53 are likely to result.

Specifically, the thickness of the adhesive-printed layers that are laminated on the upper and the lower surfaces of the mother piezoelectric substrate are likely to vary depending on their position because the adhesive agent is scratched off by a squeegee rubber in the squeegee-printing method. Also, the adhesive layers are likely to be thicker at the outer edges of the adhesive-printed areas and at the margin of the openings 54a, 54b, 55a, and 55b, and are likely to be thinner at other areas.

Therefore, when a mother layered product is produced, for example, from a mother piezoelectric substrate constituted by the piezoelectric substrates 51 assembled in a matrix pattern, the adhesive layers are thin at the cut sections of the outer edges of the adhesive layers 54 and 55 of the piezoelectric-resonant components, which were obtained by cutting the mother layered product. The adhesive layers 54 and 55 are thinner at a flat section of the cut surface of the periphery indicated by arrow A than at the margin of the openings 54a and 54b. As a result, gaps are produced at the periphery of the layered product 56 due to the reduced thickness of the adhesive layers 54 and 55, thereby causing problems, such as the external electrodes becoming loosened and/or disconnected.

SUMMARY OF THE INVENTION

To overcome the problems described above, preferred embodiments of the present invention provide a method for manufacturing electronic components that prevents disconnection and bonding strength reduction due to thickness irregularities in the adhesive layers of the electronic components. Further, preferred embodiments of the present invention provide a method for manufacturing piezoelectric-resonant components and a piezoelectric-resonant component manufactured by the method, that produces a reliable piezoelectric-resonant component by eliminating gaps due to thickness irregularities in the adhesive layers at the periphery of the piezoelectric-resonant component, when the components are produced from a mother layered product that has a mother piezoelectric substrate including energy-trap type piezoelectric-vibration units.

A method for manufacturing electronic components, according to a first preferred embodiment of the present invention, includes the steps of obtaining a mother layered product by laminating at least two mother substrates by adhesive-printing on one of the mother substrates, and producing each of the electronic components by cutting the mother layered product along a thickness direction thereof, wherein the adhesive-printing is performed in a manner that the adhesive-printed area is provided with a plurality of pass-through openings over which an adhesive layer is not formed.

According to the first preferred embodiment, the plurality of pass-through openings are preferably provided in the vicinity of the periphery of each of the electronic components.

In the method for manufacturing electronic components according to the first preferred embodiment of the present invention, adhesive-printing is performed on the mother substrate so that the plurality of the pass-through openings over which the adhesive layer is not defined are formed in the adhesive-printed area. Because an adhesive layer is thick at locations surrounding the pass-through openings, gaps caused by irregularities in the thickness of the adhesive layer of the layered product can be avoided.

Particularly, when the plurality of pass-through openings are disposed in the vicinity of the periphery of an electronic component, the gaps at the outer side surface of the electronic component can be greatly reduced, thereby reducing the risk of short-circuiting the outer electrodes, thus producing a highly moisture-resistant electronic component.

A method for manufacturing piezoelectric-resonant components, according to a second preferred embodiment of the present invention, includes the steps of preparing a mother piezoelectric substrate including a plurality of energy-trap type piezoelectric-vibration units, and preparing a first mother encapsulating substrate and a second mother encapsulating substrate to be laminated with the mother piezoelectric substrate disposed therebetween, adhesive-printing on an upper surface and a lower surface of the mother piezoelectric substrate except for annular areas around the piezoelectric vibration units, in such a manner that a plurality of pass-through openings are formed in the adhesive-printed areas of the adhesive layers, producing a mother layered product by laminating the first and the second mother encapsulating substrates with the mother piezoelectric-substrate disposed therebetween, and producing each of the piezoelectric-resonant components by cutting the mother layered product along a thickness direction thereof.

In the method for manufacturing piezoelectric-resonant components, according to the second preferred embodiment of the present invention, adhesive-printing is performed so that a plurality of pass-through openings are formed in the adhesive printed area, the adhesive-printing being performed on the upper and lower surfaces of the mother piezoelectric substrate except for annular areas around the piezoelectric-vibration units. Therefore, the adhesive layer is thick enough around the plurality of pass-through openings of the mother layered product, which is produced by the first and the second mother encapsulating-substrates being laminated, to reduce the risk of gaps being formed between the mother piezoelectric substrate and the first and second mother encapsulating substrates.

By disposing the pass-through openings in the vicinity of the periphery of the piezoelectric-resonant component, the gaps at the outer side surfaces of the completed piezoelectric resonant component can be prevented, whereby a reliable piezoelectric-resonant component is provided.

A piezoelectric-resonant component according to a third preferred embodiment of the present invention, includes a piezoelectric substrate, a first encapsulating substrate and a second encapsulating substrate laminated with the piezoelectric substrate disposed therebetween, and a first adhesive layer and a second adhesive layer for bonding the piezoelectric substrate with the first and the second encapsulating substrates, wherein the first and the second adhesive layers are provided at locations of the piezoelectric substrate except for an area around piezoelectric-vibration units included in the piezoelectric substrate, and a plurality of pass-through openings are provided in the adhesive layers.

In the piezoelectric-resonant component according to the third preferred embodiment of the present invention, the plurality of pass-through openings are preferably provided in the vicinity of the periphery of the piezoelectric-resonant component.

In the piezoelectric-resonant component according to the third preferred embodiment of the present invention, the first and the second encapsulating substrates are laminated with the piezoelectric substrate disposed therebetween via the first and the second adhesive layers. The first adhesive layer and the second adhesive layer are provided at locations on the piezoelectric substrate except around the piezoelectric vibration units included in the piezoelectric substrate. Moreover, a plurality of the pass-through openings are provided in the adhesive layers. Therefore, the adhesive layers are thick enough at locations around the pass-through openings, thereby providing high bonding-reliability of the first and the second encapsulating substrates with the piezoelectric substrate, and reducing the risk of gaps caused by the thin adhesive layers.

When the plurality of pass-through openings are provided in the vicinity of the periphery of the piezoelectric-resonant component, gaps at the outer side surface of the piezoelectric-resonant component are prevented, whereby the risk of short-circuiting of the terminal electrodes is reduced, thus, the moisture resistance is greatly improved.

Other features, elements, aspects and advantages of the present invention will become apparent from the following detailed description of preferred embodiments of the invention which refers to the accompanying drawings.

DETAILED DESCRIPTION OF PREFERRED EMBODIMENTS

Figure 1:
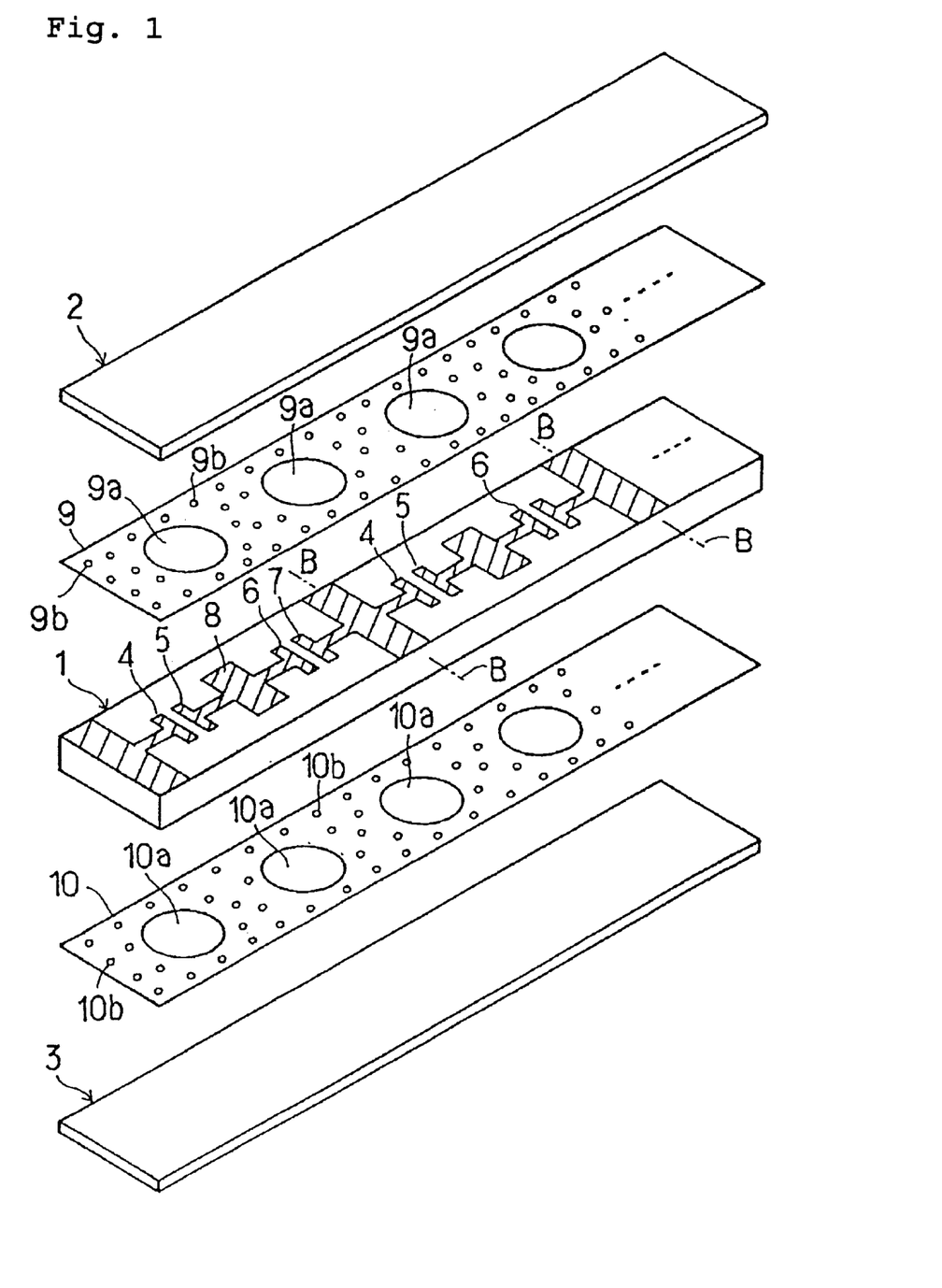
FIG. 1 is an exploded perspective view for illustrating a method for manufacturing a piezoelectric-resonant component according to preferred embodiments of the present invention.

FIG. 1 is an exploded perspective view for illustrating a method of manufacturing a piezoelectric-resonant component according to a first preferred embodiment of the present invention. Referring to FIG. 1, a mother piezoelectric substrate 1, and a first mother encapsulating substrate 2 and a second mother encapsulating substrate 3 are provided.

The mother piezoelectric substrate 1 includes a piezoelectric ceramic material, such as a lead-zirconate-titanate-type ceramic, or a piezoelectric monocrystal, such as a quartz. The mother piezoelectric substrate 1 preferably has a substantially rectangular-planar shape and includes piezoelectric substrates assembled along a longitudinal direction, to be applied to the piezoelectric-resonant components which are the final products. The mother piezoelectric-substrate 1 is cut along the dotted-chain line B as shown in FIG. 1 for obtaining the individual piezoelectric-resonant components.

The piezoelectric substrate 1 is provided with a first piezoelectric-vibration unit including exciting electrodes 4 and 5, and a second piezoelectric-vibration unit including exciting electrodes 6 and 7, both disposed on an upper surface of the piezoelectric substrate 1. The exciting electrodes 4 and 5 are arranged so as to oppose each other across a predetermined space. A common exciting electrode is provided on a bottom surface of the piezoelectric substrate 1, and is arranged to oppose the exciting electrodes 4 and 5 with the piezoelectric substrate 1 disposed therebetween. The common exciting electrode disposed on the bottom surface of the piezoelectric substrate 1 is also opposed to the exciting electrodes 6 and 7 that is included in the second piezoelectric-vibration unit with the piezoelectric substrate 1 disposed therebetween.

The exciting electrodes 5 and 6 are electrically connected to a capacitor electrode 8. An opposing capacitor electrode (not shown) is provided on the bottom surface of the piezoelectric substrate 1, and is opposed to the capacitor electrode 8.

According to the present preferred embodiment, a piezoelectric-resonant component, which is a piezoelectric filter, includes the first and the second piezoelectric-vibration units and the capacitor.

Note that according to preferred embodiments of the present invention, the configuration and the function of the electrodes that are included in the piezoelectric-resonant component are not limited to those described above.

Piezoelectric resonators having the first and the second piezoelectric-vibration units are arranged in the piezoelectric substrate 1 in series along a longitudinal direction thereof. It is necessary to provide a space for the piezoelectric-vibration units to vibrate during operation.

Therefore, adhesive layers 9 and 10 are arranged to sandwich the piezoelectric substrate 1. The adhesive layers 9 and 10 are coated on the upper surface and the bottom surface of the piezoelectric substrate 1 via a squeegee-adhesive-printing. The adhesive-printing is performed so that substantially circular openings 9a and 10a shown in FIG. 1 are provided in the adhesive layers. In other words, the adhesive-printing is performed in the areas other than the areas where the openings 9a and 10a are provided.

The present preferred embodiment is characterized by performing the adhesive-printing so that a plurality of pass-through openings 9b and 10b are formed in the area where the adhesive is printed. That is, the squeegee-adhesive-printing is performed so that, not only the openings 9a and 10a are defined, but also the plurality of pass-through openings 9b and 10b, which are smaller than the openings 9a and 10a, are defined. The plurality of openings 9b and 10b are provided in the above-described adhesive-printed area.

Next, the encapsulating substrates 2 and 3 are laminated with the piezoelectric substrate 1 disposed therebetween, and is bonded via the adhesive layers 9 and 10. The encapsulating substrates 2 and 3 may be made of an insulating material such as alumina. The material for the encapsulating substrates 2 and 3, however, is not limited to those described in the present preferred embodiment.

Figure 2:
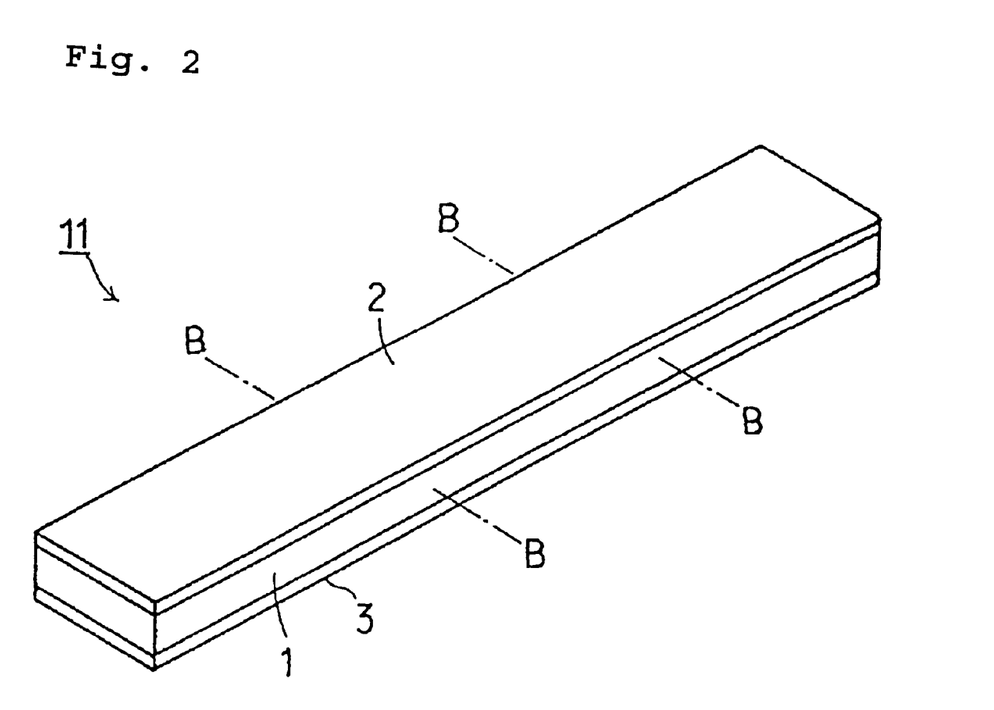
FIG. 2 is a perspective view of the units that are shown in FIG. 1 being laminated to obtain a mother layered unit.
Figure 3:
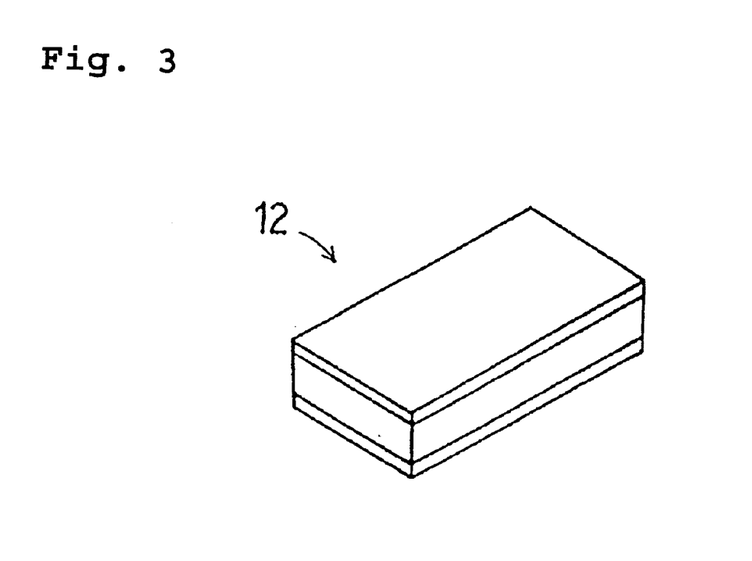
FIG. 3 is a perspective view showing a layered product obtained by cutting the mother layered unit of FIG. 2.

A mother layered product 11 as shown in FIG. 2 is produced by the above-described process. The mother layered product 11 is cut along the dotted line B as shown in FIG. 2 in the thickness direction so that the mother layered product 11 is divided into individual piezoelectric-resonant components. FIG. 3 shows a layered product 12 that is one of the piezoelectric resonant components that are produced according to the present preferred embodiment.

Figure 4:
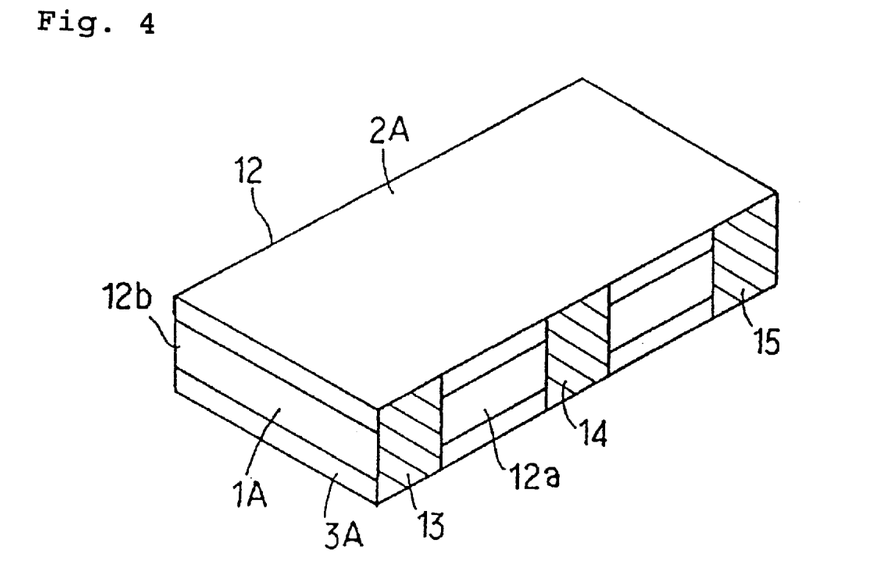
FIG. 4 is a perspective view showing a piezoelectric-resonant component produced by a method according to another preferred embodiment of the present invention.

Referring to FIG. 4, terminal electrodes 13, 14 and 15 are provided on a side surface of the layered product 12. Another plurality of terminal electrodes, which are not shown in FIG. 4, are provided on a side surface 12b which is on the other side of side surface 12a, and in the same manner as the terminal electrodes that are provided on the side surface 12a. The terminal electrodes 13, 14 and 15 may be formed by a method such as applying and curing, vapor deposition, plating, or sputtering of a conductive paste.

Figure 5:
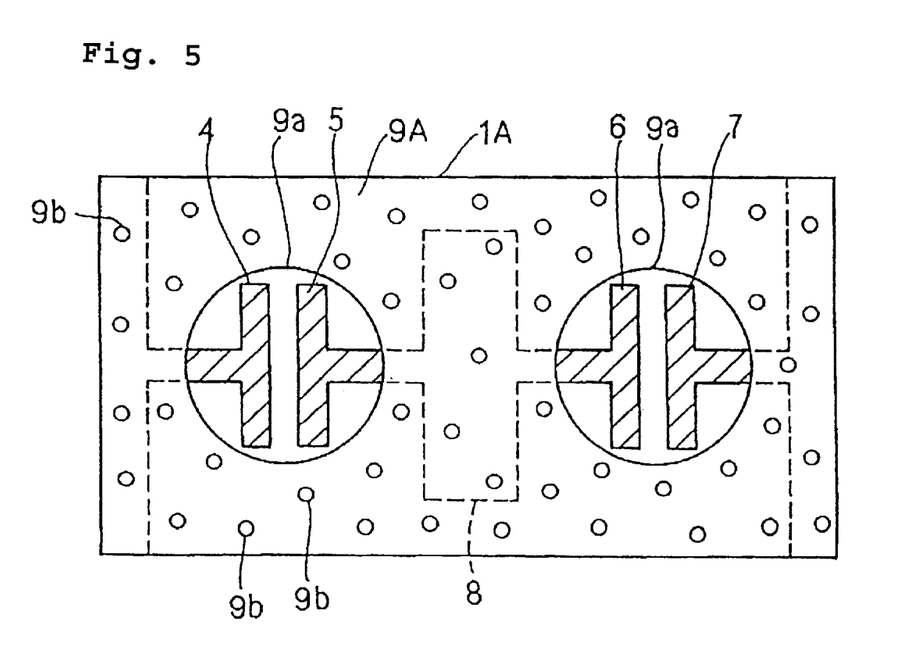
FIG. 5 is a planar sectional view showing a layered product according to a preferred embodiment of the present invention.
Figure 6A:
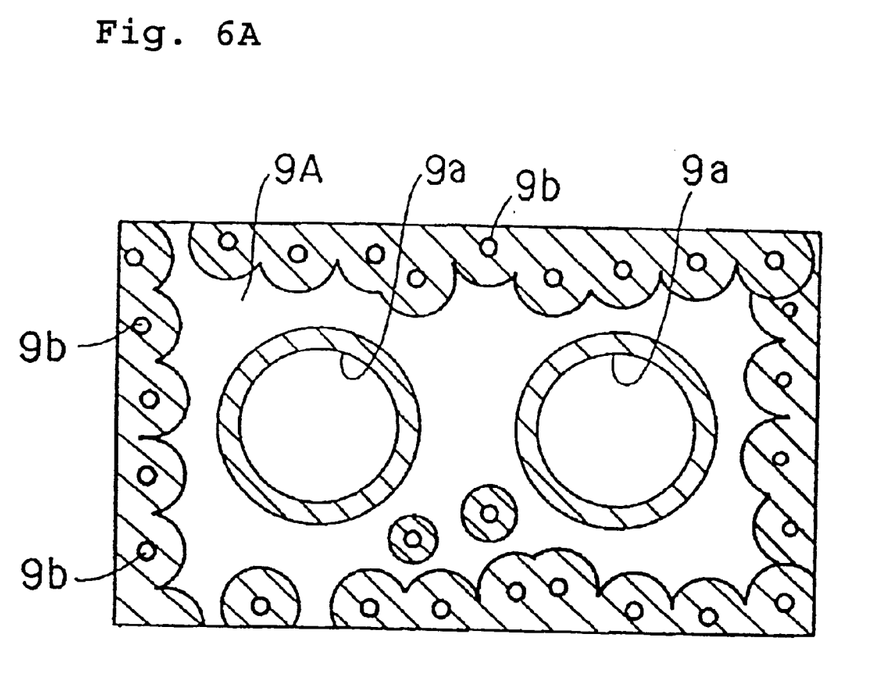
FIG. 6A is a plan view showing the thickness distribution of an adhesive layer in the piezoelectric-resonant component according to preferred embodiments of the present invention.
Figure 6B:
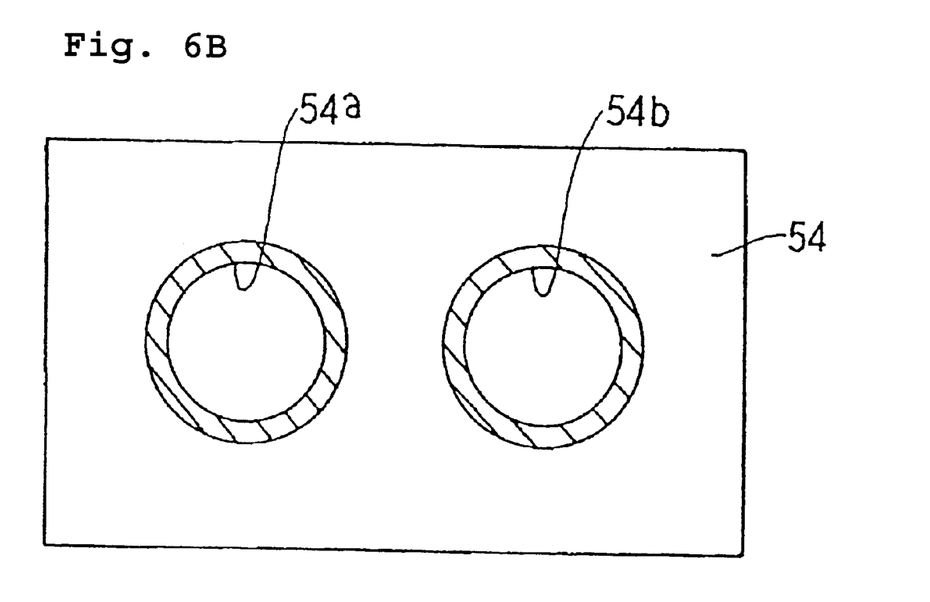
FIG. 6B is a plan view showing the thickness distribution of an adhesive layer in a piezoelectric-resonant component in the related art.

According to preferred embodiments of the present invention, a gap should not exist between the adhesive layers 9 and 10 and the encapsulating substrates 2 and 3 since the pass-through openings 9b and 10b are defined in the adhesive layers 9 and 10, thereby reducing the risk of short-circuiting or peeling-off the terminal electrodes 13, 14 and 15, which is described in conjunction with FIG. 5 and FIG. 6.

FIG. 5 is a planar sectional view of the layered product 12 of FIG. 3, in which the portion that corresponds to the upper encapsulating substrate 2 is eliminated. In the layered product 12 which is one of the individual piezoelectric-resonant components, an adhesive layer 9A is provided on the upper surface of a piezoelectric substrate 1A. Vibration units including the exciting electrodes 4, 5, 6, and 7 are exposed in the openings 9a which are formed in the adhesive layer 9. The plurality of pass-through openings 9b are defined in the adhesive-printed area of the adhesive layer 9.

Since the squeegee-printed adhesive is scratched off by a squeegee rubber, the printed adhesive is thicker at the edges of the adhesive layer, while the printed adhesive is thinner at other areas. The thickness distribution in the adhesive layer 9A is shown by the schematic plan view of FIG. 6A. In FIG. 6A, the adhesive is thicker in the diagonally-hatched area of the adhesive layer 9A as compared to the thickness of the adhesive layer 9A in the remaining areas. The adhesive is thicker around the openings 9a and also around the pass-through openings 9b.

In the piezoelectric-resonant components according to the present preferred embodiment, almost no gaps are produced, particularly at the periphery of the layered product 12, because the encapsulating substrate 2A and the piezoelectric substrate 1A are positively bonded by the adhesive layer 9 because of the adhesive layer 9A being thick at the periphery of the piezoelectric substrate 1A.

The thickness distribution of the adhesive layer of the resonant component manufactured by the conventional method is shown in FIG. 6B, in which the adhesive layer includes only the openings 9a. As mentioned previously, a major problem with the conventional method is that the adhesive layer is thick only around the openings 54a and 54b, thereby causing gaps at the side surfaces where the adhesive layer is thin, thus, short-circuiting the outer electrodes.

According to preferred embodiments of the present invention, a reliable piezoelectric-resonant component can be obtained because gaps at the periphery of a layered product due to irregularities of the adhesive thickness does not occur so that the outer electrodes 13, 14 and 15 are not short-circuited.

Note that the method according to preferred embodiments of the present invention may be applied not only to a piezoelectric filter as described in the present description, but also to the manufacture of various piezoelectric-resonant components, such as piezoelectric resonators and piezoelectric radiators, and various electronic components, such as multi-layer ceramic substrates which are formed with a plurality of ceramic substrates laminated via adhesive agents.

While the invention has been particularly shown and described with reference to preferred embodiments thereof, it will be understood by those skilled in the art that the forgoing and other changes in form and details may be made therein without departing from the spirit of the invention.

What is claimed is:

1. A method for manufacturing electronic components, comprising the steps of: providing a plurality of mother substrates including at least one vibration unit having exciting electrodes, said at least one vibration unit being provided on each of the plurality of mother substrates;

performing an adhesive-printing to form an adhesive printed area on at least one surface of at least one of the mother substrates except for at least one substantially annular area surrounding the exciting electrodes of the at least one unit, wherein the adhesive printed area defines an adhesive layer on the at least one of the mother substrates, and the step of performing the adhesive-printing includes forming a plurality of pass-through openings in the adhesive printed area at which the adhesive layer is not formed which are spaced from the at least one substantially annular area and from edges of the printed area; laminating the at least one of the mother substrates having the adhesive layer with another of the mother layered product along a thickness direction to produce a plurality of individual electronic components.

2. The method according to claim 1, wherein the step of forming the pass-through openings includes forming the pass-through openings at a periphery of each of the electronic components.

3. The method according to claim 1, wherein the adhesive layer is thicker at areas around the pass-through openings than at other locations thereof.

4. The method according to claim 1, wherein no gaps are formed at the periphery of the mother layered product.

5. A method for manufacturing piezoelectric-resonant components, comprising the steps of:

providing a mother piezoelectric substrate including a plurality of energy-trap type piezoelectric vibration units having exciting electrodes, said at least one vibration unit being provided on the mother piezoelectric substrate;

providing a first mother encapsulating substrate and a second mother encapsulating substrate;

performing an adhesive-printing to provide an adhesive printed area on a first surface and a second surface of the mother piezoelectric substrate except for substantially annular areas surrounding the exciting electrodes of the piezoelectric vibration units, wherein the adhesive printed area defines an adhesive layer on the mother piezoelectric substrate, and wherein the step of performing the adhesive printing includes forming a plurality of pass-through openings in the adhesive printed area over which the adhesive layer is not formed which are spaced from the at least one substantially annular area and from edges of the adhesive printed area;

laminating the first and the second mother encapsulating substrate with the mother piezoelectric substrate located therebetween to obtain a mother layered product; and cutting the mother layered product along a thickness direction thereof to produce a plurality of individual piezoelectric-resonant components.

6. The method according to claim 5, wherein the plurality of pass-through openings are disposed at a periphery of each of the piezoelectric resonant components.

7. The method according to claim 5, further comprising the step of providing terminal electrodes on a side surface of the mother layered product, wherein the side surface of the mother layered product is substantially perpendicular to the first surface of the piezoelectric substrate.

8. The method according to claim 5, wherein the adhesive layer is thicker at areas around the pass-through openings than at other locations thereof.

9. The method according to claim 5, wherein no gaps are formed at the periphery of the mother layered product.

* * * * *